(12) United States Patent
Hwang

(10) Patent No.: US 10,753,970 B2
(45) Date of Patent: Aug. 25, 2020

(54) METHOD FOR RETESTING WAFER

(71) Applicant: Yen-Kai Hwang, Taipei (TW)

(72) Inventor: Yen-Kai Hwang, Taipei (TW)

( * ) Notice: Subject to any disclaimer, the term of this patent is extended or adjusted under 35 U.S.C. 154(b) by 51 days.

(21) Appl. No.: 16/267,784

(22) Filed: Feb. 5, 2019

(65) Prior Publication Data

US 2019/0250207 A1  Aug. 15, 2019

(30) Foreign Application Priority Data

Feb. 12, 2018  (TW) .............................. 107105093 A

(51) Int. Cl.
*G01R 31/01* (2020.01)
*G01R 31/28* (2006.01)
*G01R 1/073* (2006.01)
*G01R 1/067* (2006.01)

(52) U.S. Cl.
CPC ..... *G01R 31/2831* (2013.01); *G01R 1/06705* (2013.01); *G01R 1/07392* (2013.01); *G01R 31/2886* (2013.01); *G01R 31/2887* (2013.01); *G01R 31/2889* (2013.01); *G01R 31/2891* (2013.01); *G01R 1/07314* (2013.01); *G01R 1/07378* (2013.01)

(58) Field of Classification Search
CPC ............ G01R 31/2887; G01R 31/2891; G01R 31/2886; G01R 1/06705; G01R 1/07314; G01R 31/2889; G01R 1/07378; G01R 31/2831
See application file for complete search history.

(56) References Cited

U.S. PATENT DOCUMENTS

| | | | |
|---|---|---|---|
| 2013/0265068 A1* | 10/2013 | Amoah | G11C 29/12 324/750.3 |
| 2016/0061883 A1* | 3/2016 | Engberg | G01J 5/02 324/754.23 |
| 2017/0074922 A1* | 3/2017 | Lai | H01L 22/32 |

\* cited by examiner

*Primary Examiner* — Raul J Rios Russo
(74) *Attorney, Agent, or Firm* — Muncy, Geissler, Olds & Lowe, P.C.

(57) ABSTRACT

A method for retesting a wafer is provided, including following steps of: providing a wafer having dice; providing a plurality of probe sets each including probes used to test the dice; on the basis of a first threshold, the probe sets respectively test the dice so as to classify the dice into first dice and retesting dice, each value obtained from testing each of the first dice being higher than the first threshold, each value obtained from testing each of the retesting dice being lower than the first threshold; conducting a smart sifting operation to classify the retesting dice of the wafer into second dice and third dice, wherein value obtained from testing each of the second dice is higher than a second threshold, and value obtained from testing each of the third dice is lower than the second threshold.

10 Claims, 8 Drawing Sheets

| standard probe set 4 | qualified rate | optimal pin selection operation ||||||  |
|---|---|---|---|---|---|---|---|---|
| | | retesting dice | position of probe | retesting dice | position of probe | retesting dice | position of probe | |
| probe 0 | 92.5% | ■ | 0 | ■ | 1 | ■ | 2 | first block 61 |
| probe 1 | 94.5% | □ | 1 | □ | 2 | □ | 3 | |
| probe 2 | 93.5% | □ | 2 | □ | 3 | □ | 4 | |
| probe 3 | 94.5% | ▨ | 3 | ▨ | 4 | ▨ | 5 | |
| probe 4 | 95.9% | □ | 4 | □ | 5 | □ | 6 | |
| probe 5 | 97.2% | ■ | 5 | ■ | 6 | ■ | 7 | |
| probe 6 | 95.7% | □ | 6 | □ | 7 | □ | | |
| probe 7 | 90.5% | □ | 7 | □ | | □ | | |
| first ensemble average | 94.29% | second ensemble average ||||||  |
| | | 94.73% || 95.37% || 93.73% || |

FIG. 6

| standard probe set 4A | qualified rate | optimal pin selection operation ||||||  |
|---|---|---|---|---|---|---|---|---|
| | | retesting dice | position of probe | retesting dice | position of probe | retesting dice | position of probe | |
| probe0 probe8 | 92.5% | □ 2 | □ 10 | □ 3 | □ 11 | □ 4 | □ 12 | section 63 |
| probe1 probe9 | 94.5% | □ 3 | ■ 11 | □ 4 | ■ 12 | □ 5 | ■ 13 | |
| probe2 probe10 | 93.5% | ▨ 4 | □ 12 | ▨ 5 | □ 13 | ▨ 6 | □ 14 | first block 61 |
| probe3 probe11 | 94.5% | □ 5 | ▨ 13 | □ 6 | ▨ 14 | □ 7 | ▨ 15 | |
| probe4 probe12 | 95.9% | □ 6 | □ 14 | □ 7 | □ 15 | □ | □ | |
| probe5 probe13 | 97.2% | □ 7 | □ 15 | □ | □ | □ | □ | |
| probe6 probe14 | 95.7% | □ | ■ | □ | ■ | □ | ■ | section 63 |
| probe7 probe15 | 90.5% | □ | □ | □ | □ | □ | □ | |
| first ensemble average | 94.29% | second ensemble average ||||||  |
| | | 85.11% || 98.57% || 99.17% || |

FIG. 7

METHOD FOR RETESTING WAFER

BACKGROUND OF THE INVENTION

Field of the Invention

The present invention relates to a method for retesting a wafer.

Description of the Prior Art

In recent years, the technology of semiconductor advances rapidly, and the need for semiconductors grows every day, for example but limited thereto, mobile phones, computers, TVs and smart electronics; therefore, the dimension of a wafer grows from 6 inches, 8 inches and finally to 12 inches so as to increase production capacity to meet the needs. The equipment and operation processes of manufacturing wafers are costly, and not all companies can afford that amount of money, so the industry comes out with OEM (Original Equipment Manufacturer) production mode, and TSMC (Taiwan Semiconductor Manufacturing Company, Limited) in Taiwan is the classic example of OEM.

It is understandable that the cost of manufacturing the wafer is high, and in addition to increase the production area to elevate the production capacity, the industry also works hard to find ways to further lift qualified rate, decrease waste of cost and increase revenue.

In the modern testing method, after a wafer is tested for the first time, a wafer image is produced, and then a probe set will test again along the same path to decrease the opportunity that the dice which are usable are mistaken as unqualified. However, in this method, the test conditions are the same, so the results between the first test and the second test have little difference, and many dice which are usable may still be mistaken as unqualified and cause waste of cost.

The present invention has arisen to mitigate and/or obviate the afore-described disadvantages.

SUMMARY OF THE INVENTION

The major object of the present invention is to provide a method for retesting a wafer, which can determine a retesting die more reliably to sift out qualified products as many as possible to increase a number of dice which are usable and can further elevate the production capacity, decrease waste of cost and increase revenue.

To achieve the above and other objects, a method for retesting a wafer, including following steps of: providing a wafer, the wafer having a plurality of dice; providing a plurality of probe sets, each of the plurality of probe sets including a plurality of probes used to test the plurality of dice; on the basis of a first threshold, the plurality of probe sets respectively test the plurality of dice so as to classify the plurality of dice into a plurality of first dice and a plurality of retesting dice, each value obtained from testing each of the plurality of first dice being higher than the first threshold, each value obtained from testing each of the plurality of retesting dice being lower than the first threshold; conducting a smart sifting operation to classify the plurality of retesting dice of the wafer into a plurality of second dice and a plurality of third dice, wherein each value obtained from testing each of the plurality of second dice is higher than a second threshold, and each value obtained from testing each of the plurality of third dice is lower than the second threshold, the smart sifting operation includes following steps of: picking out an optimal probe from the plurality of probes, the optimal probe being defined as one of the plurality of probes which tests the plurality of first dice and gets a greatest qualified rate, on the basis of the second threshold, the optimal probe sifting the plurality of retesting dice of the wafer one by one; or picking out a standard probe set from the plurality of probe sets, the standard probe set having a greatest first ensemble average, the plurality of probes of respective one of the plurality of probe sets testing the plurality of dice and getting the qualified rates of the plurality of first dice, the first ensemble average being defined as an aggregation average of the qualified rates of the plurality of dice, then the wafer being divided sequentially into a plurality of first blocks which are continuously arranged, a greatest number of the dice of each of the plurality of first blocks being equal to a number of the probes of the standard probe set, on the basis of the second threshold, the standard probe set sifting at least one of the plurality of retesting dice of each of the plurality of first blocks; or picking out the standard probe sets from the plurality of probe sets, taking a greatest number of the retesting dice, which can be included when the standard probe set corresponds to the plurality of dice, as a criterion, dividing the wafer sequentially into a plurality of second blocks, a greatest number of the dice of each of the plurality of second blocks being equal to the number of the probes of the standard probe set, on the basis of the second threshold, the standard probe set sifting at least one of the plurality of retesting dice of each of the plurality of second blocks.

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

FIG. 6 is a drawing showing an optimal pin selection operation of the embodiment of the present invention;

FIG. 7 is a drawing showing the optimal pin selection operation of the embodiment of the present invention in another mode;

DETAILED DESCRIPTION OF THE PREFERRED EMBODIMENTS

Figure 1:
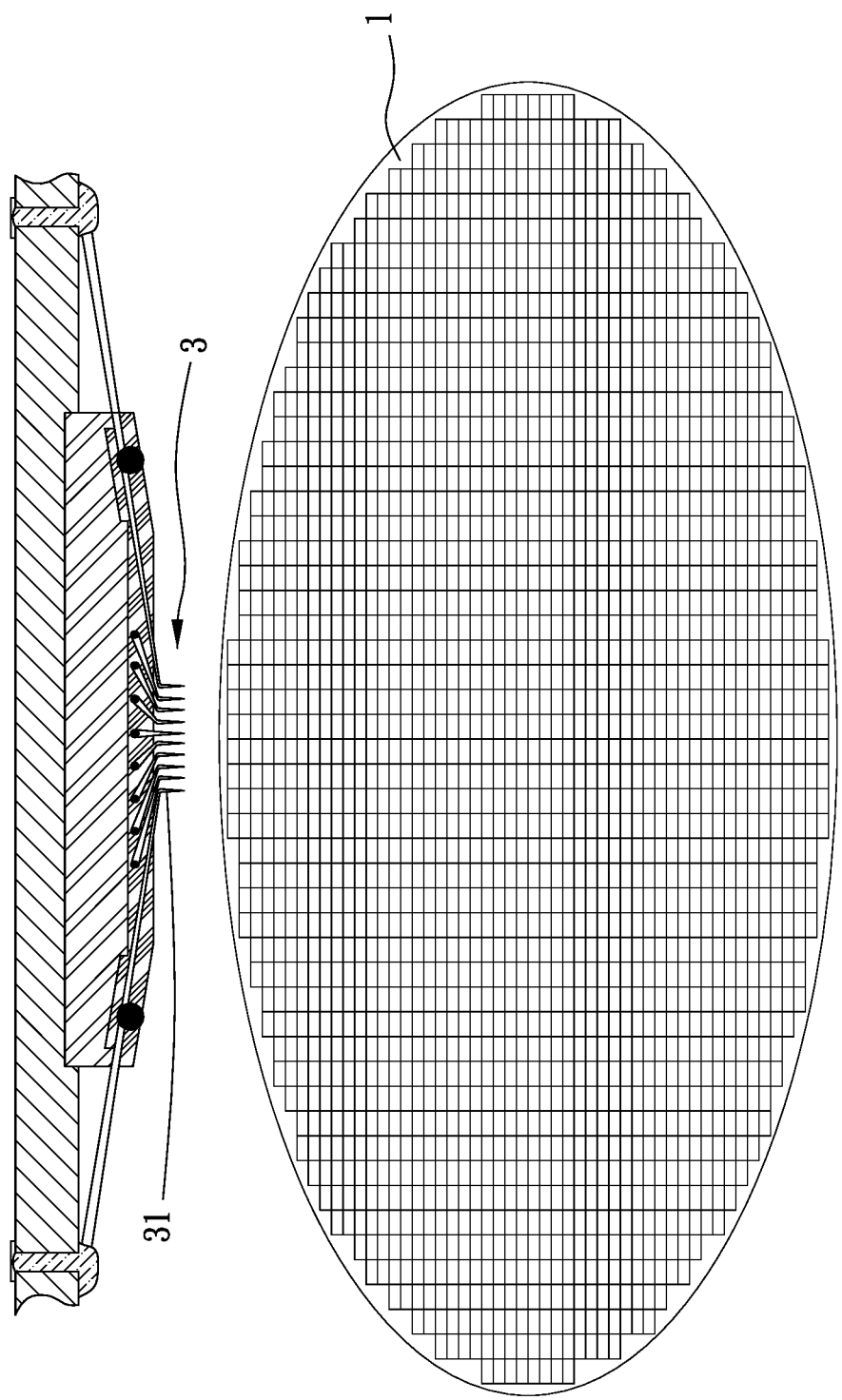
FIG. 1 is a stereogram of an embodiment of the present invention.
Figure 2:
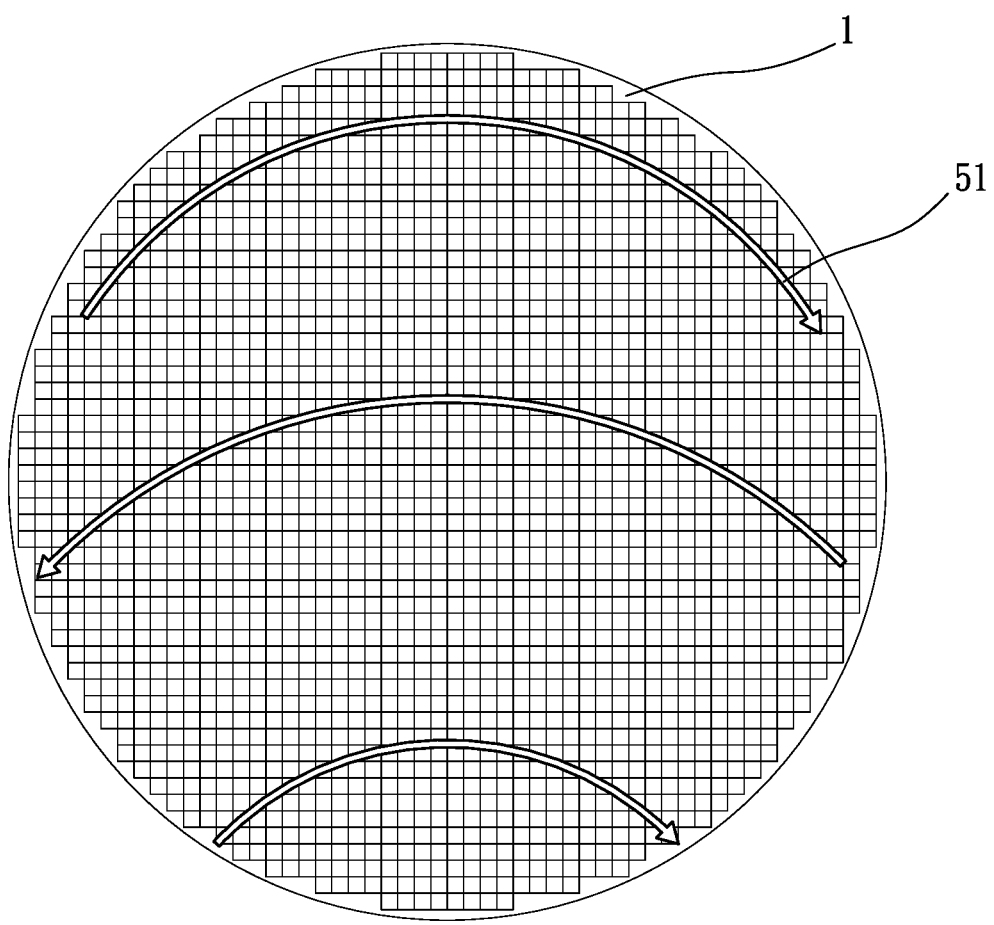
FIG. 2 is a drawing showing a testing path of the embodiment of the present invention.
Figure 3:
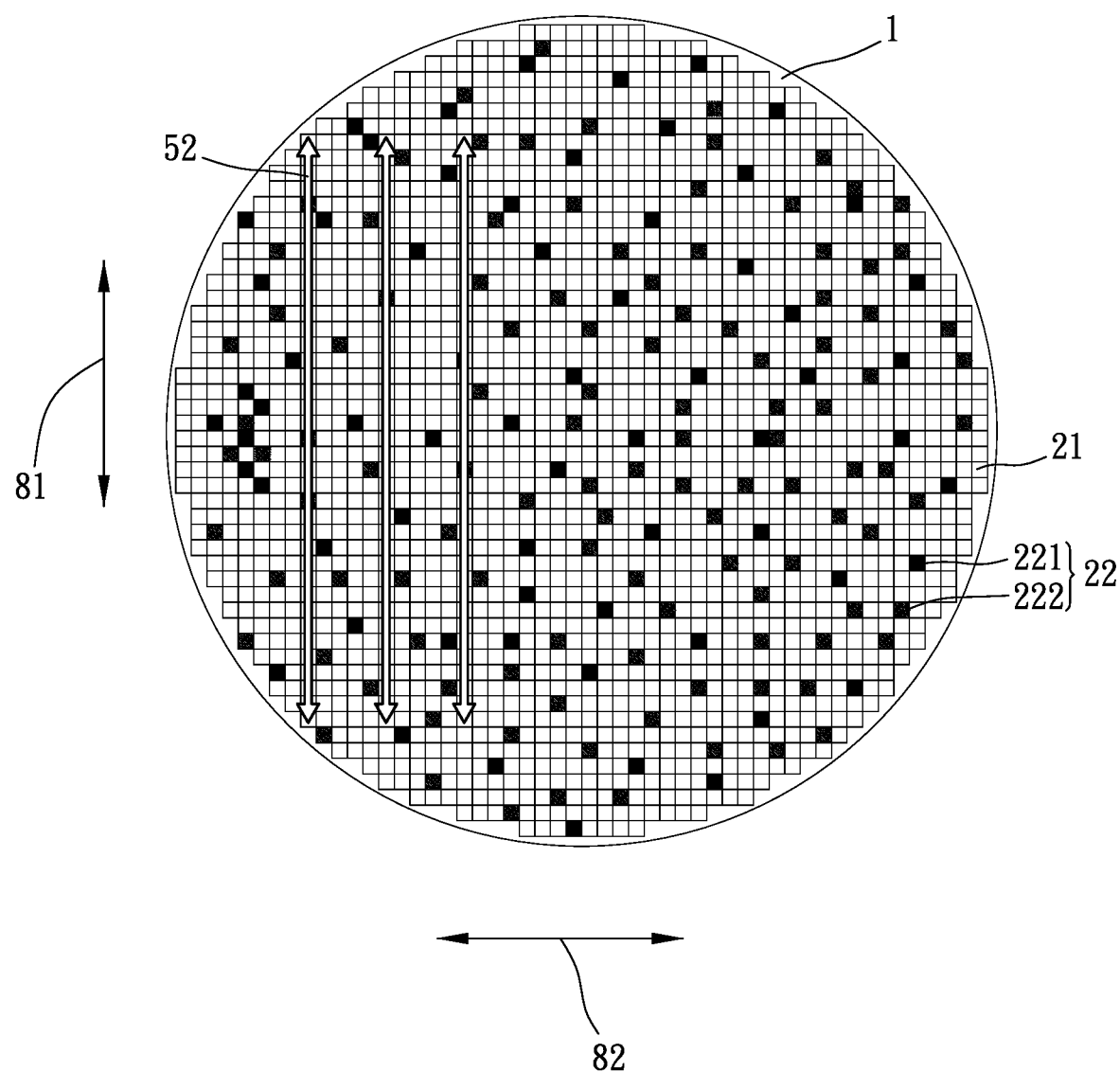
FIG. 3 is a drawing showing a retesting path of the embodiment of the present invention.
Figure 4:
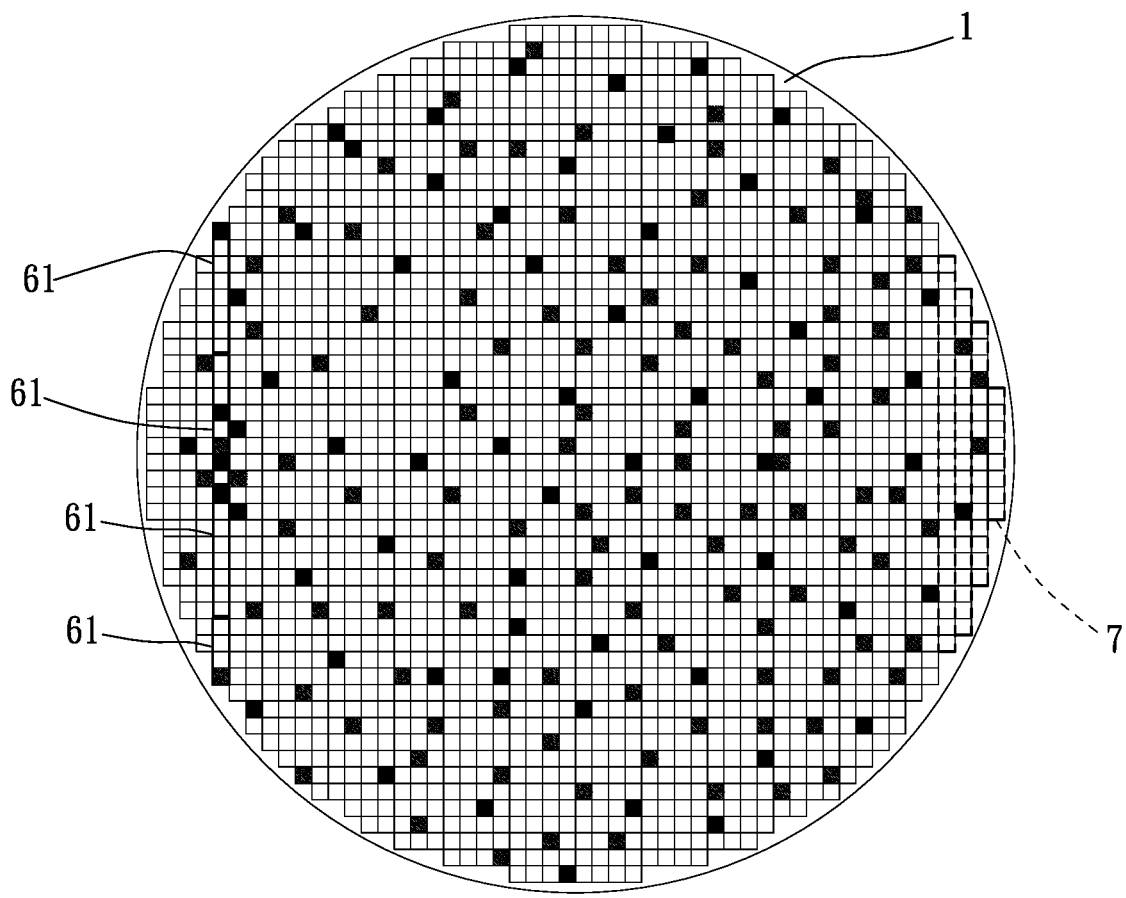
FIG. 4 is drawing showing a first block and a sifting layer of the embodiment of the present invention.
Figure 5:
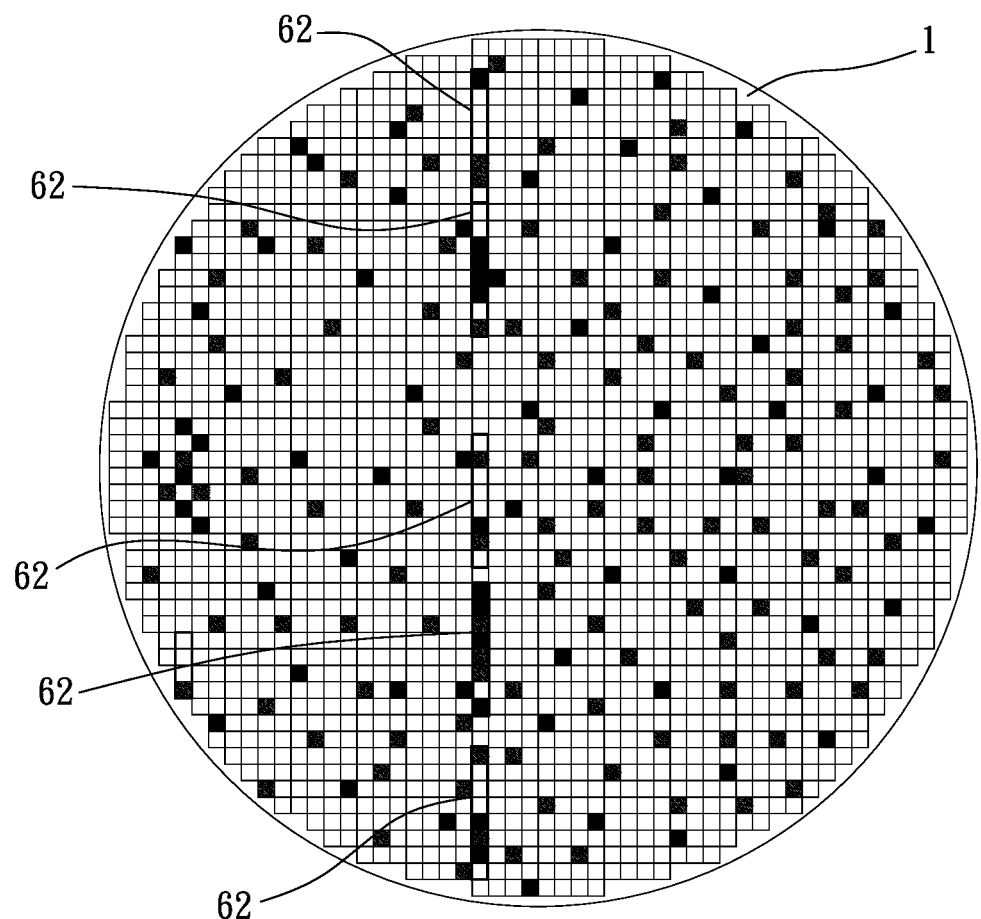
FIG. 5 is a drawing showing a second block of the embodiment of the present invention.

The present invention will be clearer from the following description when viewed together with the accompanying drawings, which show, for purpose of illustrations only, the preferred embodiment in accordance with the present invention.

Please refer to FIGS. 1 to 9 for an embodiment of the present invention, a method for retesting a wafer includes following steps of:

Providing a wafer 1, the wafer 1 having a plurality of dice. Further providing a plurality of probe sets 3, each of the plurality of probe sets 3 including a plurality of probes 31 used to test the plurality of dice.

On the basis of a first threshold, the plurality of probe sets 3 respectively test the plurality of dice so as to classify the plurality of dice into a plurality of first dice 21 and a plurality of retesting dice 22, wherein each value obtained from testing each of the plurality of first dice 21 is higher than the first threshold, and each value obtained from testing each of the plurality of retesting dice 22 is lower than the first threshold.

After above-mentioned testing processes, the plurality of probe sets 3 respectively have the value of testing the plurality of dice, the value includes a qualified rate of the first die 21, and a smart sifting operation can be conducted to classify the plurality of retesting dice 22 of the wafer 1 into a plurality of second dice 221 and a plurality of third dice 222, wherein the value obtained from testing each of the plurality of second dice 221 is higher than a second threshold, and the value obtained from testing each of the plurality of third dice 222 is lower than the second threshold.

In this embodiment, the second threshold is equal to the first threshold, so the plurality of second dice 221 are obviously qualified products which are mistaken in the first sifting. Through the retesting method of the smart sifting operation, a precision of determining if the wafer 1 is qualified largely increases, a number of qualified products (the plurality of first dice 21 and the plurality of second dice 221) also increases, and the retesting method can further effectively lower cost and increase production capacity and revenue. In other embodiments, the second threshold can be defined as smaller than the first threshold. In that case, the plurality of second dice can be distinguished from the plurality of first dice 21 and be used as qualified products of another degraded patch for other usages.

For example but limited thereto, the smart sifting operation includes three following modes to meet different needs.

In mode I, an optimal probe is picked out from the plurality of probes 31, the optimal probe is defined as one of the plurality of probes 31 which tests the plurality of first dice 21 and gets a greatest qualified rate, and on the basis of the second threshold, the optimal probe sifts the plurality of retesting dice 22 of the wafer 1 one by one. In this mode, a number of the qualified products would be the greatest, so the qualified products can be prevented from being mistaken, and the wafer 1 can be fully and effectively used.

In mode II, a standard probe set 4 is picked out from the plurality of probe sets 3, the standard probe set 4 has a greatest first ensemble average, the plurality of probes 31 of respective one of the plurality of probe sets 3 tests the plurality of dice and gets the qualified rates of the plurality of first dice 21, the first ensemble average is defined as an aggregation average of the qualified rates of the plurality of dice 21, then the wafer 1 is divided sequentially into a plurality of first blocks 61 which are continuously arranged, a greatest number of the dice of each of the plurality of first blocks 61 is equal to a number of the probes 31 of the standard probe set 4, and on the basis of the second threshold, the standard probe set 4 sifts at least one of the plurality of retesting dice 22 of each of the plurality of first blocks 61.

More specifically, the plurality of probes 31 of the standard probe set 4 are arranged into a plurality of rows and at least one column, for example but not limited thereto, the plurality of probes 31 of the standard probe set 4 can be arranged into 1 column and 8 rows, 2 columns and 8 rows and others, an extension direction of each of the at least one column is defined as a first direction 81, an extension direction of each of the plurality of rows is defined as a second direction 82, a part of the wafer 1 corresponding to the at least one column of the standard probe set 4 is divided into a plurality of sifting layers 7 which are arranged along the second direction 82, each of the plurality of sifting layers 7 includes the plurality of first blocks 61 on the first direction 81, and after the standard probe set 4 sifts the plurality of retesting dice 22 of one of the plurality of sifting layers 7 along the first direction 81, the standard probe set 4 shifts to another of plurality of sifting layers 7 to sift.

More specifically, the standard probe set 4 conducts an optimal pin selection operation in each of the plurality of first blocks 61 and sifts at least one said retesting die 22 of each of the plurality of first blocks 61, in the optimal pin selection operation, the standard probe set 4 takes one of the plurality of first blocks 61 as a standard and shifts in different extents on the first direction 81 so that the at least one said retesting die 22 of the first block 61 corresponds to the plurality of probes 31 of the standard probe set 4 and gets a plurality of second ensemble averages, and a position of the standard probe set 4 when getting an optimal second ensemble average is an optimal position for sifting the plurality of first blocks 61; wherein the second ensemble average is defined as an aggregation average of qualified rates of some of the probes 31 which correspond to the at least one said retesting die 22.

Therefore, through the optimal pin selection operation, a user can target one of the plurality of first blocks 61 to find relatively optimal position for the standard probe set 4 to sift so as to increase a number of the second dice 221 and prevent qualified products from being missed, and further maximize the production capacity. The at least one said retesting die 22 simultaneously corresponds to different sifting methods of the plurality of probes of the standard probe set 4, so the test time can be effectively controlled within a shorter period of time and maintain retesting efficiency.

Finally, in mode III, the standard probe set 4 is picked out from the plurality of probe sets 3, a greatest number of the retesting dice 22, which can be included when the standard probe set 4 corresponds to the plurality of dice is taken, as a criterion to divide the wafer 1 sequentially into a plurality of second blocks 62, a greatest number of the dice of each of the plurality of second blocks 62 is equal to the number of the probes 31 of the standard probe set 4, and the standard probe set 4 takes the second threshold as the standard to sift at least one of the plurality of retesting dice 22 of each of the plurality of second blocks 62.

In mode III, for example, in one of the plurality of sifting layers 7, if a middle part of the sifting layer 7 has more retesting dice 22, the first second block 62 is chosen based on the middle part which circles the greatest number of the retesting dice 22, and the second block 62 is chosen based on one of the rest parts which circle the greatest number of the retesting dice 22. For example, the first second block 62 circles 8 of the retesting dice 22, the second block 62 circles 6 of the retesting dice 22, and the third second block 62 circles 4 of the retesting dice 22 and so forth.

It's understandable that to retest in mode III, the testing time is the shortest, so mode III can greatly decrease the retesting time and especially useful when a large number of products need to be produced in a short period of time. Mode II strikes a balance between mode I and mode III, so to retest in mode II, both the number of qualified products found and the testing time can be optimized.

It is to be noted that because the smart sifting operation only retests the plurality of first blocks 61 or the plurality of second blocks 62 which have the at least one said retesting die 22, if there are only first dice 21 in the plurality of first blocks 61 or the plurality of second blocks 62, then the plurality of first blocks 61 or the plurality of second blocks 62 do not need to be tested. Therefore, the number and time of testing can be largely decreased.

In addition, each of the plurality of probe sets 3 tests the plurality of dice along a testing path 51, on the testing path 51, each of the plurality of probe sets 3 crosses the plurality of the sifting layers 7 along the second direction 82 to test, and after the plurality of dice on the second direction 82 have been tested, and then moves along the first direction 81 to continue testing, if a moving path of the standard probe set 4 moving in each of the plurality of sifting layers 7 is defined as a retesting path 52, the retesting path 52 is different from the testing path 51. Through sifting the plurality of retesting dice 22 with the plurality of standard probe sets 4 in different paths, factors which may cause errors due to shifted contact points or contact angles between the probe 31 and each of the plurality of dice on the paths can be excluded, and the qualified products can be determined more accurately. In this embodiment, the testing path 51 is arced, and the retesting path 52 is linear.

Figure 8:
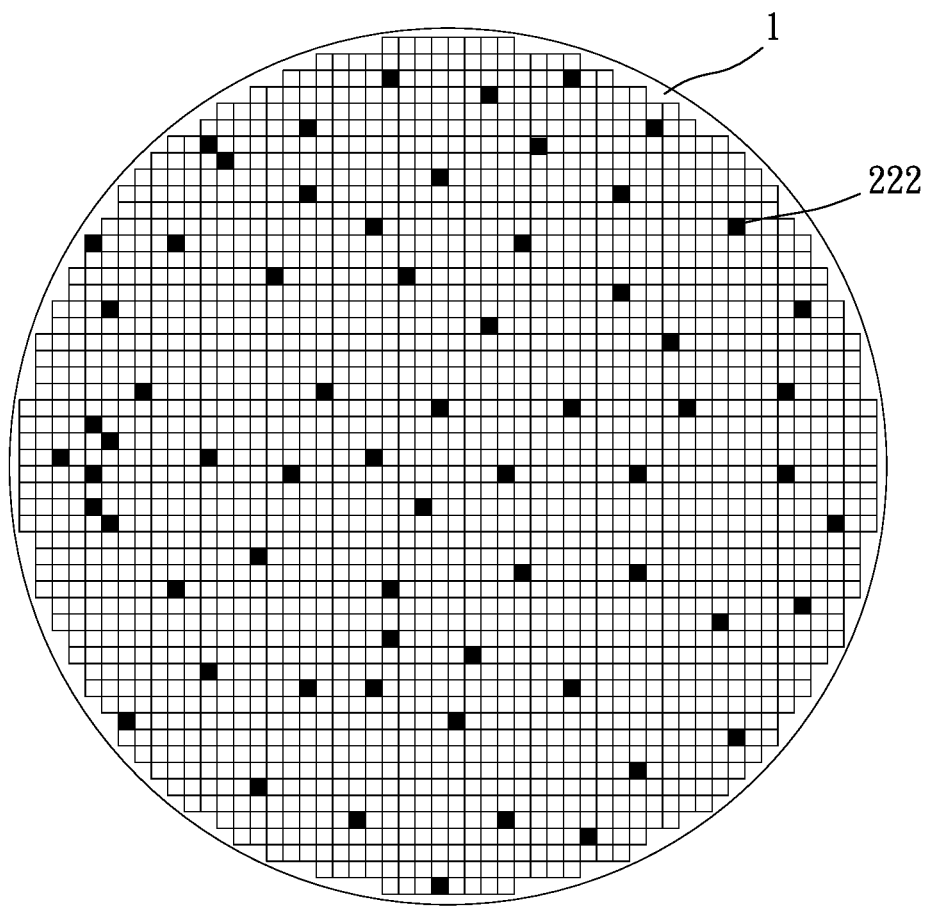
FIG. 8 is a drawing showing a wafer being tested of the embodiment of the present invention.
Figure 9:
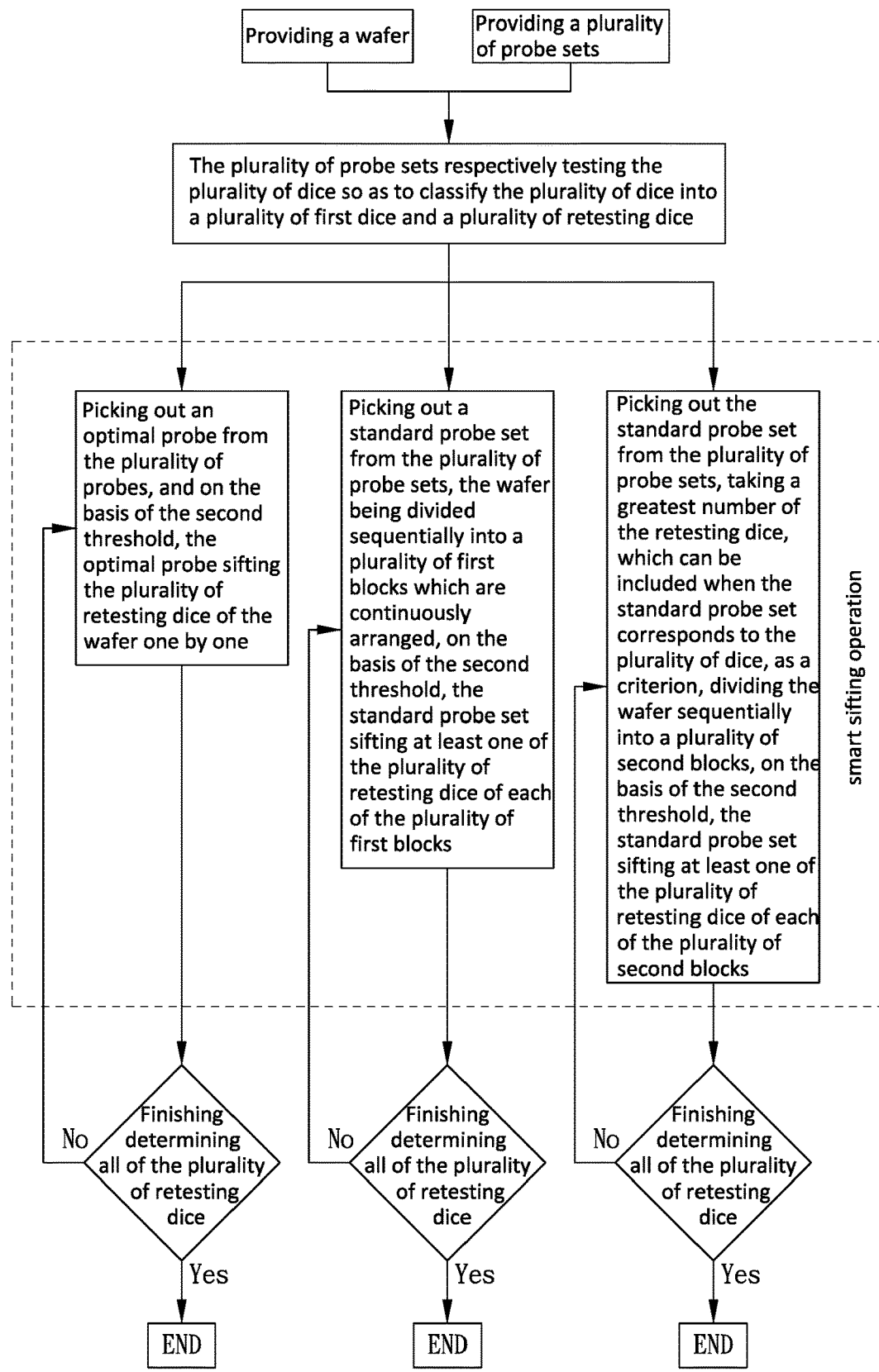
FIG. 9 is a flow chart of the embodiment of the present invention.

Furthermore, the optimal pin selection operation has other modes other than having the first block 61 as the standard, if a user wants to further increase the number of the dice (the plurality of first dice 21 and the plurality of second dice 221) which are qualified, please refer to FIG. 8, another mode of the optimal pin selection operation is provided, and another arrangement mode (2 columns and 8 rows) of the standard probe set 4A is shown.

The optimal pin selection operation further divides the first block 61A into a plurality of sections 63.

The standard probe set 4A takes one of the plurality of sections 63 as a standard and shifts in different extents on the first direction 81 so that the at least one said retesting die 22 of the section 63 corresponds to the plurality of probes 31 of the standard probe set 4A and gets a plurality of third ensemble averages.

Similarly, a position of the standard probe set 4A when getting an optimal third ensemble average is an optimal position for sifting the section 63; wherein the third ensemble average is defined as an aggregation average of qualified rates of some of the probes 31 which correspond to the at least one said retesting die 22. The first block 61A is divided into the plurality of sections 63 which are smaller so there will be more deviation sets, the plurality of probes 31 which have higher qualified rate can correspond to the retesting dice 22 to obtain more of the second dice 221.

Specifically, in this mode, the optimal pin selection operation takes, on the first direction, a dense distribution of the at least one said retesting die 22 of one of the plurality of first blocks 61A as a standard to divide the plurality of sections 63. More specifically, a number of the plurality of section 63 is two, and the difference between respective numbers of the retesting dice 22 of the two sections 63 is more than two. Hence, the user can choose different retesting modes of the optimal pin selection operation according to different needs.

Given the above, in the method for retesting a wafer, after the plurality of first dice are found through testing, the smart sifting operation sifts the retesting dice to find the plurality of second dice and the plurality of third dice (the first and second dice are qualified dice which are usable) so as to maximize the product capacity, decrease loss and increase revenue. In addition, the optimal pin selection operation can further find the best testing positions of the standard probe set for each of the plurality of blocks in order to get more qualified products. The smart sifting operation has many determination modes for various needs.

While we have shown and described various embodiments in accordance with the present invention, it should be clear to those skilled in the art that further embodiments may be made without departing from the scope of the present invention.

What is claimed is:

1. A method for retesting a wafer, including following steps of:
   providing a wafer, the wafer having a plurality of dice;
   providing a plurality of probe sets, each of the plurality of probe sets including a plurality of probes used to test the plurality of dice;
   on the basis of a first threshold, the plurality of probe sets respectively test the plurality of dice so as to classify the plurality of dice into a plurality of first dice and a plurality of retesting dice, each value obtained from testing each of the plurality of first dice being higher than the first threshold, each value obtained from testing each of the plurality of retesting dice being lower than the first threshold;
   conducting a smart sifting operation to classify the plurality of retesting dice of the wafer into a plurality of second dice and a plurality of third dice, wherein each value obtained from testing each of the plurality of second dice is higher than a second threshold, and each value obtained from testing each of the plurality of third dice is lower than the second threshold, the smart sifting operation includes following steps of:
   picking out an optimal probe from the plurality of probes, the optimal probe being defined as one of the plurality of probes which tests the plurality of first dice and gets a greatest qualified rate, and on the basis of the second threshold, the optimal probe sifting the plurality of retesting dice of the wafer one by one; or
   picking out a standard probe set from the plurality of probe sets, the standard probe set having a greatest first ensemble average, the plurality of probes of respective one of the plurality of probe sets testing the plurality of dice and getting qualified rates of the plurality of first dice, the first ensemble average being defined as an aggregation average of the qualified rates of the plurality of dice, then the wafer being divided sequentially into a plurality of first blocks which are continuously arranged, a greatest number of the dice of each of the plurality of first blocks being equal to a number of the probes of the standard probe set, on the basis of the second threshold, the standard probe set sifting at least one of the plurality of retesting dice of each of the plurality of first blocks; or
   picking out the standard probe set from the plurality of probe sets, taking a greatest number of the retesting dice, which can be included when the standard probe set corresponds to the plurality of dice, as a criterion, dividing the wafer sequentially into a plurality of second blocks, a greatest number of the dice of each of the plurality of second blocks being equal to the number of the probes of the standard probe set, on the basis of the second threshold, the standard probe set sifting at least one of the plurality of retesting dice of each of the plurality of second blocks.

2. The method for retesting a wafer of claim 1, wherein the plurality of probes of the standard probe set are arranged into a plurality of rows and at least one column, an extension direction of each of the at least one column is defined as a first direction, an extension direction of each of the plurality of rows is defined as a second direction, a part of the wafer corresponding to the at least one column of the standard probe set is divided into a plurality of sifting layers which are arranged along the second direction, each of the plurality of sifting layers includes the plurality of first blocks on the first direction, and after the standard probe set sifts the plurality of retesting dice of one of the plurality of sifting layers along the first direction, the standard probe set shifts to another of plurality of sifting layers to sift.

3. The method for retesting a wafer of claim 2, wherein each of the plurality of probe sets tests the plurality of dice along a testing path, a moving path of the standard probe set moving in each of the plurality of sifting layers is defined as a retesting path, and the retesting path is different from the testing path.

4. The method for retesting a wafer of claim 3, wherein on the testing path, each of the plurality of probe sets crosses the plurality of the sifting layers along the second direction to test, and after the plurality of dice on the second direction have been tested, and then moves along the first direction to continue testing.

5. The method for retesting a wafer of claim 2, wherein the standard probe set conducts an optimal pin selection operation in each of the plurality of first blocks and sifts at least one said retesting die of each of the plurality of first blocks, in the optimal pin selection operation, the standard probe set takes one of the plurality of first blocks as a standard and shifts in different extents on the first direction so that the at least one said retesting die of the first block corresponds to the plurality of probes of the standard probe set and gets a plurality of second ensemble averages, and a position of the standard probe set when getting an optimal second ensemble average is an optimal position for sifting the plurality of first blocks; wherein the second ensemble average is defined as an aggregation average of qualified rates of some of the probes which correspond to the at least one said retesting die.

6. The method for retesting a wafer of claim 2, wherein the standard probe set conducts an optimal pin selection operation in each of the plurality of first blocks and sifts at least one said retesting die of each of the plurality of first blocks, in the optimal pin selection operation, the first block is divided into a plurality of sections, the standard probe set takes one of the plurality of sections as a standard and shifts in different extents on the first direction so that the at least one said retesting die of the section corresponds to the plurality of probes of the standard probe set and gets a plurality of third ensemble averages, and a position of the standard probe set when getting an optimal third ensemble average is an optimal position for sifting the section; wherein the third ensemble average is defined as an aggregation average of qualified rates of some of the probes which correspond to the at least one said retesting die.

7. The method for retesting a wafer of claim 6, wherein the optimal pin selection operation takes, on the first direction, a dense distribution of the at least one said retesting die of one of the plurality of first blocks as a standard to divide the plurality of sections.

8. The method for retesting a wafer of claim 7, wherein a number of the plurality of section is two, and the difference between respective numbers of the retesting dice of the two sections is more than two.

9. The method for retesting a wafer of claim 1, wherein the second threshold is equal to the first threshold.

10. The method for retesting a wafer of claim 4, wherein the testing path is arced, and the retesting path is linear; the standard probe set conducts an optimal pin selection operation in each of the plurality of first blocks and sifts at least one said the retesting die of each of the plurality of first blocks, in the optimal pin selection operation, the standard probe set takes one of the plurality of first blocks as a standard and shifts in different extents on the first direction so that the at least one said retesting die of the first block corresponds to the plurality of probes of the standard probe set and gets a plurality of second ensemble averages, and a position of the standard probe set when getting an optimal second ensemble average is an optimal position for sifting the plurality of first blocks; wherein the second ensemble average is defined as an aggregation average of qualified rates of some of the probes which correspond to the at least one said retesting die; the second threshold is equal to the first threshold; the plurality of probes of the standard probe set is arranged into 1 column and 8 rows.

* * * * *